(12) United States Patent
Wang

(10) Patent No.: US 11,784,063 B2
(45) Date of Patent: Oct. 10, 2023

(54) PACKAGING METHOD AND PACKAGING DEVICE FOR SELECTIVELY ENCAPSULATING PACKAGING STRUCTURE

(71) Applicant: JIANGSU CHANGJIANG ELECTRONICS TECHNOLOGY CO., LTD., Jiangyin (CN)

(72) Inventor: Jie Wang, Jiangyin (CN)

(73) Assignee: JIANGSU CHANGJIANG ELECTRONICS TECHNOLOGY CO., LTD., Jiangyin (CN)

(*) Notice: Subject to any disclaimer, the term of this patent is extended or adjusted under 35 U.S.C. 154(b) by 141 days.

(21) Appl. No.: 17/275,171

(22) PCT Filed: Jan. 23, 2019

(86) PCT No.: PCT/CN2019/072852
§ 371 (c)(1),
(2) Date: Mar. 10, 2021

(87) PCT Pub. No.: WO2020/057035
PCT Pub. Date: Mar. 26, 2020

(65) Prior Publication Data
US 2022/0044942 A1    Feb. 10, 2022

(30) Foreign Application Priority Data
Sep. 20, 2018 (CN) .......................... 201811102238.X

(51) Int. Cl.
*H01L 21/56* (2006.01)
*H01L 21/67* (2006.01)

(52) U.S. Cl.
CPC ...... *H01L 21/566* (2013.01); *H01L 21/67126* (2013.01)

(58) Field of Classification Search
CPC ............ H01L 21/566; H01L 21/67126; H01L 21/561; H01L 23/3121; H01L 21/568; H01L 21/56
See application file for complete search history.

(56) References Cited

U.S. PATENT DOCUMENTS 5,882,957 A * 3/1999 Lin .................. H01L 23/49816
257/E23.101
5,884,396 A * 3/1999 Lin .................... H01L 23/3128
438/102

(Continued)

FOREIGN PATENT DOCUMENTS

CN     101071799 A     11/2007
CN     106449545 A *    2/2017 ........... B06B 1/0622

(Continued)

*Primary Examiner* — Mohammed Shamsuzzaman
(74) *Attorney, Agent, or Firm* — Cheng-Ju Chiang

(57) ABSTRACT

The present invention provides a packaging method and a packaging device for selectively encapsulating a packaging structure. The method includes: providing a substrate; mounting components on the substrate, the components including a component that needs to be encapsulated and a component that does not need to be encapsulated; forming a protective structure in an area of the component that does not need to be encapsulated so as to form a protective area for isolating the component that does not need to be encapsulated and an encapsulating area located outside the protective area; filling the encapsulating area with an injection molding material; and removing the protective structure. According to the present invention, any part of the packaging structure may be selectively encapsulated by self-adjustment as required. The operation is simple, and the process flow is simplified.

4 Claims, 9 Drawing Sheets

(56) References Cited

U.S. PATENT DOCUMENTS

| | | | | |
|---|---|---|---|---|
| 6,667,543 B1* | 12/2003 | Chow | H01L 27/14618 | 257/676 |
| 7,405,100 B1* | 7/2008 | Mostafazadeh | H01L 27/14632 | 438/114 |
| 8,330,270 B1* | 12/2012 | Lin | H01L 23/49503 | 257/784 |
| 8,581,109 B2* | 11/2013 | Tuominen | H01L 23/544 | 174/260 |
| 10,529,593 B2* | 1/2020 | Wang | H01L 23/367 | |
| 10,798,823 B2* | 10/2020 | Iihola | H01L 23/5389 | |
| 2004/0046264 A1* | 3/2004 | Ho | H01L 21/563 | 257/E21.503 |
| 2006/0006523 A1* | 1/2006 | Coyle | B81C 1/00333 | 257/704 |
| 2007/0166867 A1* | 7/2007 | Chow | H01L 27/14618 | 438/65 |
| 2008/0315369 A1* | 12/2008 | Yun | H01L 23/3164 | 257/690 |
| 2010/0109169 A1* | 5/2010 | Kolan | H01L 25/0655 | 257/E23.116 |
| 2010/0270608 A1* | 10/2010 | Pham | H01L 21/2815 | 438/424 |
| 2011/0156571 A1* | 6/2011 | Lin | H01L 51/5246 | 445/44 |
| 2013/0126928 A1* | 5/2013 | Kao | H01L 33/385 | 438/27 |
| 2014/0124906 A1* | 5/2014 | Park | H01L 23/3128 | 257/659 |
| 2015/0123290 A1* | 5/2015 | Kim | H01L 25/105 | 257/777 |
| 2015/0340307 A1* | 11/2015 | Gabler | H01L 23/49524 | 257/676 |
| 2016/0049372 A1* | 2/2016 | Ho | H01L 33/64 | 257/773 |
| 2016/0218091 A1* | 7/2016 | Du | H01L 24/48 | |
| 2016/0315284 A1* | 10/2016 | Jeon | H01L 51/5246 | |
| 2017/0316957 A1* | 11/2017 | Chen | H01L 23/315 | |
| 2019/0027443 A1* | 1/2019 | Murtuza | H01L 23/16 | |
| 2019/0096699 A1* | 3/2019 | Chiang | H01L 23/3171 | |
| 2019/0267362 A1* | 8/2019 | Feil | H01L 24/08 | |
| 2019/0295944 A1* | 9/2019 | Kwon | H01L 21/568 | |
| 2019/0341352 A1* | 11/2019 | We | H01L 23/498 | |
| 2021/0028150 A1* | 1/2021 | Yen | H01L 23/13 | |
| 2021/0327840 A1* | 10/2021 | Pei | H01L 24/25 | |

FOREIGN PATENT DOCUMENTS

| | | | | |
|---|---|---|---|---|
| CN | 108441839 A | | 8/2018 | |
| CN | 108448008 A | | 8/2018 | |
| CN | 110299330 A | * | 10/2019 | H01L 21/565 |
| CN | 108133912 B | * | 2/2021 | H01L 21/565 |
| KR | 10-1103336 B1 | | 1/2012 | |
| WO | WO-2006102801 A1 | * | 10/2006 | H01L 23/24 |

* cited by examiner

PACKAGING METHOD AND PACKAGING DEVICE FOR SELECTIVELY ENCAPSULATING PACKAGING STRUCTURE

The present application claims priority to Chinese Patent Application 201811102238.X, filed on Sep. 20, 2018 and titled "PACKAGING METHOD AND PACKAGING DEVICE FOR SELECTIVELY ENCAPSULATING PACKAGING STRUCTURE", which is incorporated herein by reference in its entirety.

TECHNICAL FIELD

The present invention relates to the technical field of semiconductor packaging, in particular to a packaging method and a packaging device for selectively encapsulating a packaging structure.

BACKGROUND

With the growth in demands of users, the demand for encapsulating chips has changed. In the past, it was required to encapsulate the whole substrate. At present, it is only required to encapsulate some components on the substrate for some products. In the prior art, multiple operations are required to meet the above demand of users, which reduces the encapsulating efficiency and increases the encapsulating cost.

SUMMARY

The objectives of the present invention are to provide a packaging method for selectively encapsulating a packaging structure and to provide a packaging device for the same.

In order to achieve one of the aforementioned objectives of the invention, the present invention provides a packaging method for selectively encapsulating a packaging structure. The method includes: S1, providing a substrate;

S2, mounting components on the substrate, the components including a component that needs to be encapsulated and a component that does not need to be encapsulated;

S3, forming a protective structure in an area of the component that does not need to be encapsulated so as to form a protective area for isolating the component that does not need to be encapsulated and an encapsulating area located outside the protective area;

S4, filling the encapsulating area with an injection molding material; and

S5, removing the protective structure.

As a further improvement of an embodiment of the present invention, the S3 specifically includes:

mounting a protective film on an external surface of the component that does not need to be encapsulated; and forming a temporary protective cover outside the protective film so as to form the protective area for isolating the component that does not need to be encapsulated and the encapsulating area located outside the protective area.

As a further improvement of an embodiment of the present invention, forming the temporary protective cover outside the protective film specifically includes:

forming the temporary protective cover outside the protective film, wherein a sealed chamber is enclosed between the temporary protective cover and the substrate, and the sealed chamber contacts with the protective film or a gap is provided between the sealed chamber and the protective film.

As a further improvement of an embodiment of the present invention, forming the temporary protective cover outside the protective film specifically includes:

for each component that does not need to be encapsulated, forming an independent temporary protective cover outside the component that does not need to be encapsulated so as to form the protective area; or for adjacent components that do not need to be encapsulated, forming a same temporary protective cover outside the adjacent components that do not need to be encapsulated so as to form the protective area.

As a further improvement of an embodiment of the present invention, after the S4, the method further includes:

sputtering a metal layer on an external surface of the encapsulating area; or sputtering a metal layer on the external surface of the encapsulating area and the protective area simultaneously.

As a further improvement of an embodiment of the present invention, if the metal layer is sputtered on external surfaces of the protective area and the encapsulating area simultaneously, the S5 further includes:

removing the sputtered metal layer in the protective area when the protective structure is removed.

In order to achieve the other objective of the invention, the present invention provides a packaging device for selectively encapsulating a packaging structure. The device includes: a pedestal, configured to bear a substrate on which a component that needs to be encapsulated and a component that does not need to be encapsulated are mounted;

a protective structure generating unit, configured to form a protective structure in an area of the component that does not need to be encapsulated so as to form a protective area for isolating the component that does not need to be encapsulated and an encapsulating area located outside the protective area;

an injection molding unit, configured to fill the encapsulating area with an injection molding material; and a removing unit, configured to remove the protective structure after encapsulation is completed.

As a further improvement of an embodiment of the present invention, the protective structure generating unit is specifically configured to mount a protective film on an external surface of the component that does not need to be encapsulated, and to form a temporary protective cover outside the protective film so as to form the protective area for isolating the component that does not need to be encapsulated and the encapsulating area located outside the protective area.

As a further improvement of an embodiment of the present invention, the packaging device further includes: a shielding layer generating unit, the shielding layer generating unit being configured to sputter a metal layer on an external surface of the encapsulating area, or to sputter a metal layer on the external surface of the encapsulating area and the protective area simultaneously.

As a further improvement of an embodiment of the present invention, after the metal layer is sputtered on the external surface of the encapsulating area and the protective area simultaneously by the shielding layer generating unit, the removing unit is further configured to remove the metal layer sputtered on the protective area when the protective structure is removed.

The beneficial effect of the present invention is that, with the packaging method and the packaging device for selectively encapsulating the packaging structure provided in the present invention, any part of the packaging structure may be selectively encapsulated by self-adjustment as required, the operation is simple, and the process flow is simplified.

DETAILED DESCRIPTION

The present invention will be described in detail in combination with the embodiments shown in the accompanying drawings. However, these embodiments do not limit the present invention, and the structural or functional changes made by those skilled in the art according to these embodiments are included in the protection scope of the present invention.

Figure 1:
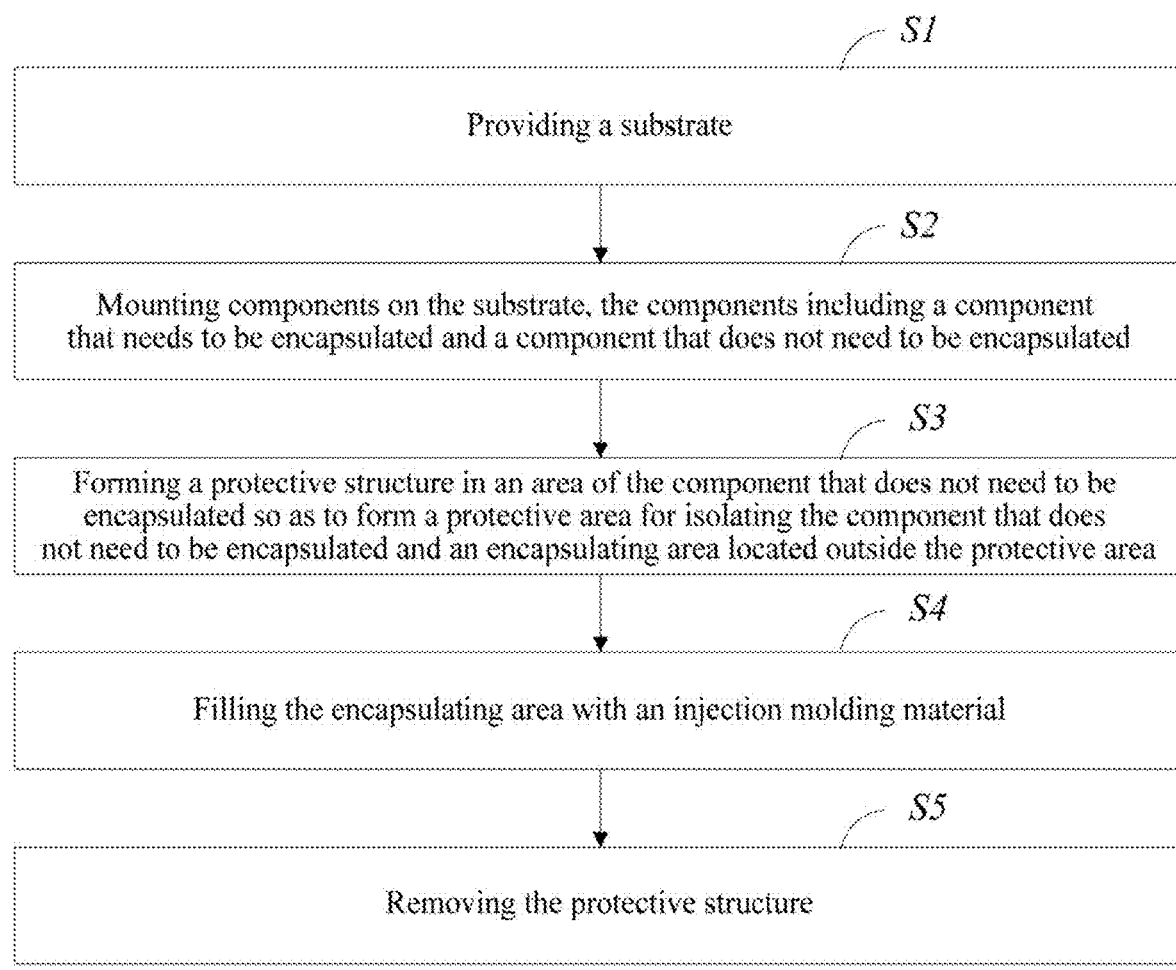
FIG. 1 is a flow diagram of a packaging method for selectively encapsulating a packaging structure provided by a first embodiment of the present invention.
Figure 2:
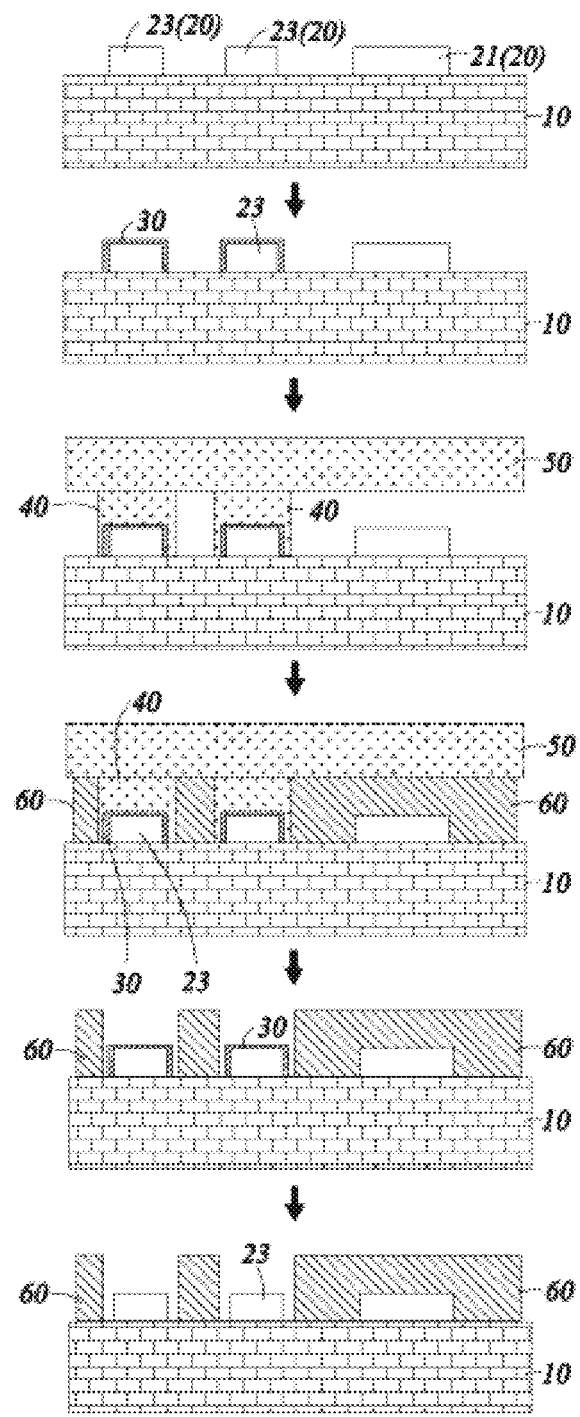
FIGS. 2 and 3 are step diagrams corresponding to the packaging method shown in FIG. 1 of the present invention.
Figure 3:
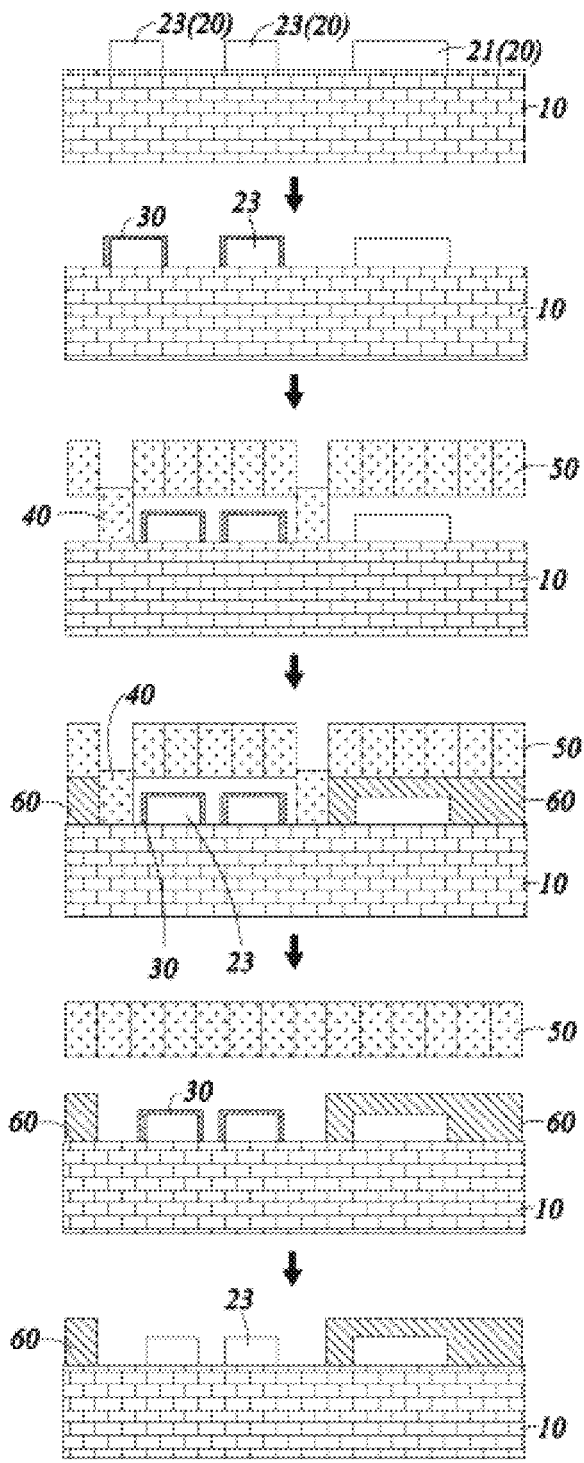

As shown in FIGS. 1, 2 and 3, a first embodiment of the present invention provides a packaging method for selectively encapsulating a packaging structure. The packaging method includes the following steps.

In S1, a substrate 10 is provided; the substrate may usually be a PCB board, one side of which is coated with solder or adhesive or the like for mounting components.

In S2, components 20 are mounted on the substrate 10, the components including a component 21 that needs to be encapsulated and a component 23 that does not need to be encapsulated.

The packaging structure usually includes: a substrate 10, the components 20 are arranged on the substrate 10, and a plastic packaging material for packaging the components. According to the specific application environment of the packaging structure, the components 20 arranged on the substrate 10 are divided into two categories, the component 21 that needs to be encapsulated and the component 23 that does not need to be encapsulated. Generally, the components are functional chips and passive devices, and the functional chips are active electronic components that require energy sources to implement specific functions, and are generally used for signal amplification, conversion and the like. The passive devices are electronic components that may display characteristics thereof without using an external power supply, and mainly include resistance, inductance and capacitance devices, wherein the passive devices such as resistors, capacitors, inductors, converters, faders, matching networks, resonators, filters, frequency mixers and switches have a common characteristic that they can work when there is a signal without using a power supply in the circuit.

In S3, a protective structure is formed in an area of component 23 that does not need to be encapsulated so as to form a protective area for isolating the component 23 that does not need to be encapsulated and an encapsulating area located outside the protective area.

In a preferred embodiment of the present invention, a protective film 30 is mounted on an external surface of a component 23 that does not need to be encapsulated; a temporary protective cover 40 is formed outside the protective film 30 so as to form the protective area for isolating the component 23 that does not need to be encapsulated and the encapsulating area located outside the protective area.

The external surface of the component 23 that does not need to be encapsulated includes: a side edge and an upper surface of the component 23 that does not need to be encapsulated, that is, the protective structure completely isolates the component 23 that does not need to be encapsulated from the external space.

It can be understood that the protective structure may also be only a protective film, or only a protection cover, or any other structure which isolates the component 23 that does not need to be encapsulated from the outside, which will not be described in detail herein.

Further, in a preferred embodiment of the present invention, forming the temporary protective cover outside the protective film specifically includes: forming a temporary protective cover 40 outside the protective film 30, wherein a sealed chamber is enclosed between the temporary protective cover 40 and the substrate 10, and the sealed chamber contacts with the protective film 30 or a gap is provided between the sealed chamber and the protective film 30. The temporary protective cover 40 arranged in this way can play a double-protection role. The temporary protective cover 40 can prevent water vapor, plastic packaging materials and the like from entering the sealed chamber, so as to avoid contaminating the component 23 that does not need to be encapsulated, and can avoid damaging component 23 that does not need to be encapsulated when there is a gap between the temporary protective cover 40 and the component 23 that does not need to be encapsulated, and the size of the protective area can be flexibly controlled by the volume of the protection cover.

In a specific embodiment of the present invention, the protective film 30 is an exposure and development protective film and for example, the material thereof is a photoresist. Accordingly, the protective film 30 can be automatically recognized by an image recognition technology to determine the position of the protective area. Further, the temporary protective cover 40 is formed outside the protective film 30.

The protective cover 40 is covered on the protective area and may be a detachable metal partition plate. As shown in FIG. 2, in an embodiment of the present invention, a mold 50 is arranged. The mold 50 is configured above the substrate 10 during the process of encapsulating the packaging structure. The mold 50 has an image recognition function. After the protective area is recognized, the temporary protective cover 40 is arranged at a corresponding position of the mold 50, so as to realize selective encapsulation.

Figure 4:
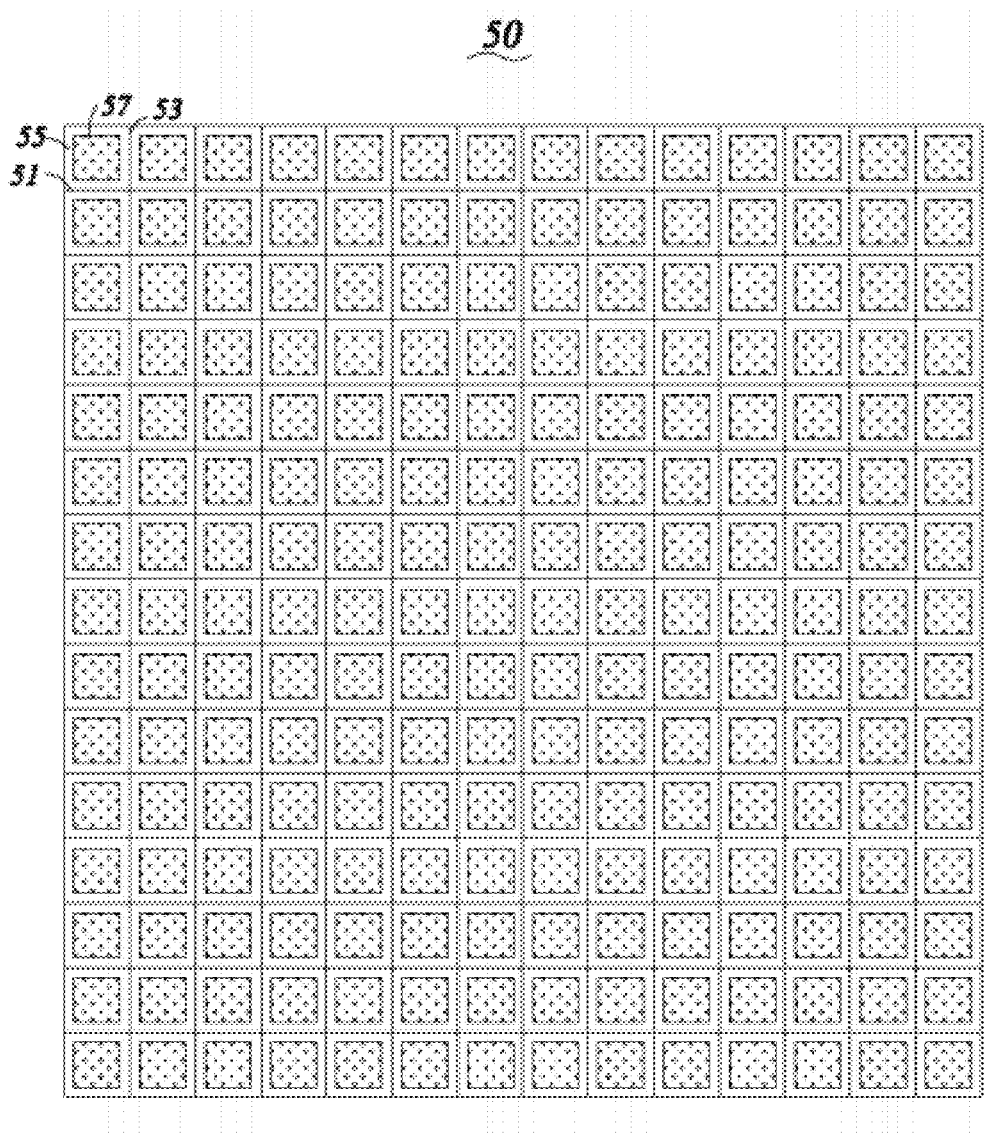
FIG. 4 is a structural schematic diagram of an upper mold in an embodiment of the present invention.

As shown in FIGS. 3 and 4, the mold 50 includes: a frame which has staggered transverse frames 51 and vertical frames 53, wherein several accommodating holes 55 of the same size are formed between the transverse frames 51 and the vertical frames 53, and a protective block 57 which can move freely along an extension direction of the accommodating holes 55 is arranged in each accommodating hole 55; a protective cover 40 which is formed after at least one protective block 57 is lowered down; a supporting structure which is configured to secure the mold 50 above the substrate 10; an image recognizing unit which is configured to recognize the protective area; and a controlling unit which is configured to control the start of the image recognizing unit and to control the movement of the protective block 57 along an extension direction of the accommodating holes 55.

In the specific embodiment, the controlling unit controls the image recognizing unit. When the protective area is recognized by the image recognizing unit, the controlling unit further controls the protective block surrounding the protective area to lower down, so as to form a protective cover to cover the protective area. When the encapsulation is completed, the controlling unit controls the lowered protective block to rise and retract into the corresponding accommodating hole so as to remove the protective cover 40 corresponding to the protective area.

Of course, in other embodiments of the present invention, there are various structures that can implement functions of the mold in this embodiment, which will not be described in detail herein.

In addition, as shown in FIGS. 2 and 3, in a preferred embodiment of the present invention, the method further includes: for each component 23 that does not need to be encapsulated, forming an independent temporary protective cover 40 outside the component 23 that does not need to be encapsulated so as to form the protective area; or for adjacent components 23 that do not need to be encapsulated, forming a same temporary protective cover 40 outside the adjacent components 23 that do not need to be encapsulated so as to form the protective area.

Further, after the step S3, the method further includes: S4, filling the encapsulating area with an injection molding material.

In a specific embodiment of the present invention, a height between a lower bottom surface of the mold 50 and a surface of the substrate 10 on which the components 20 are mounted is equal to an encapsulating thickness of the packaging structure. When the protective block 57 is lowered down on the substrate 10, several gaps are formed between the substrate 10 and the mold 50, so that the gaps formed between the substrate 10 and the mold 50 may be directly filled with an injection molding material 60 for encapsulation.

In S5, the protective structure is removed.

In the aforementioned specific example of the present invention, the protective structure includes the protective cover 40 and the protective film 30. When the protective structures are removed, it is required to remove various protective structures in a reverse order of installation. In this example, it is required to remove the protective cover 40 at first and then remove the protective film 30.

In a preferred embodiment of the present invention, a mold 50 is adopted to form a temporary protective cover on the substrate 10. At this moment, a protective block 57 may be controlled to rise and be accommodated in an accommodating hole 55. That is, a temporary protective cover 40 on the substrate may be removed. Of course, the temporary protective cover 40 on the substrate 10 may also be removed by removing the mold 50.

In an optional embodiment of the present invention, a protective film 30 on a component 23 that does not need to be encapsulated may be removed by using a chemical solvent. In a specific example of the present invention, a protective film 30 mounted on a surface of a component 23 that does not need to be encapsulated is removed by an exposure and development technology so as to form a packaging structure.

Figure 5:
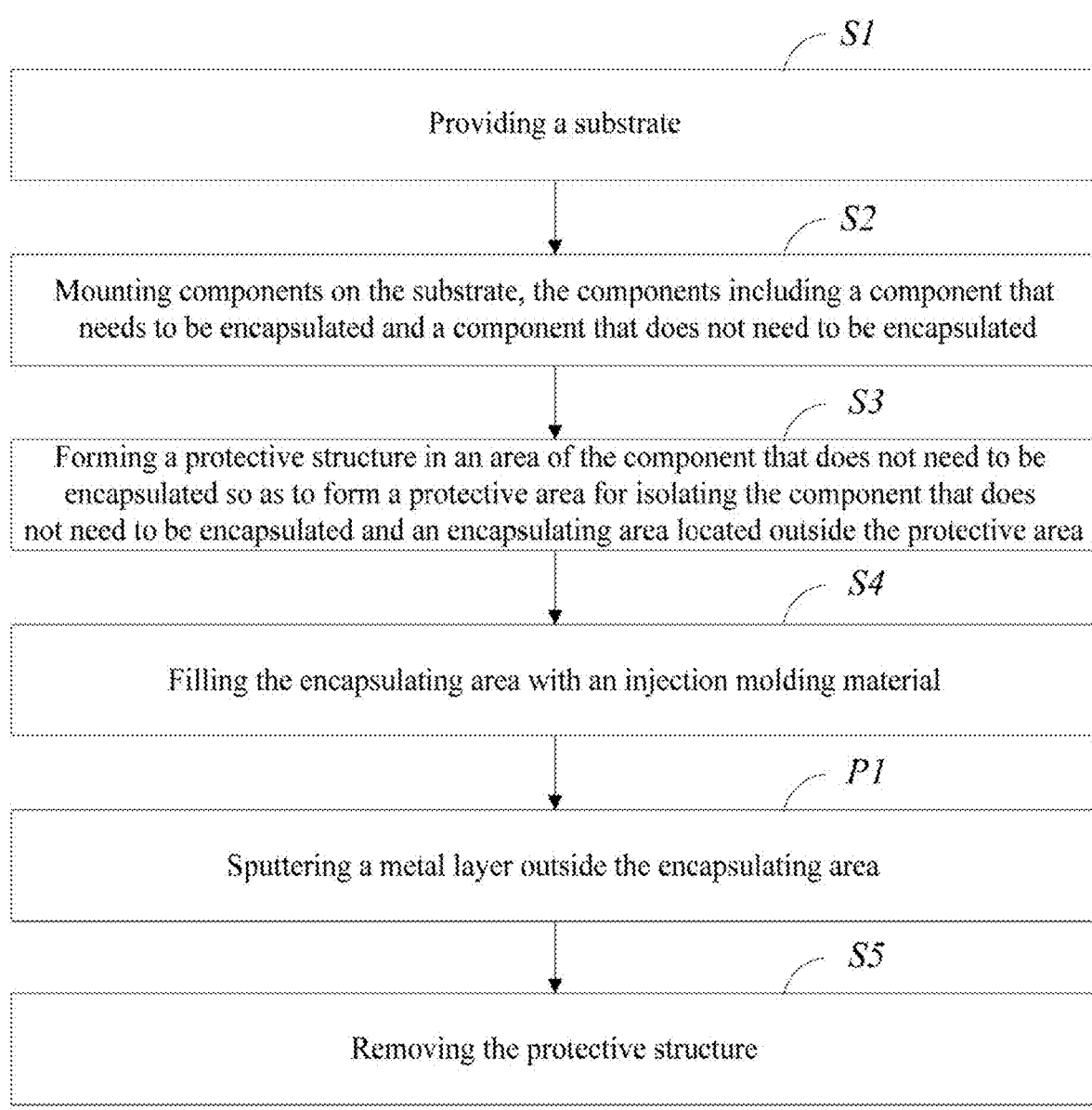
FIG. 5 is a flow diagram of a packaging method for selectively encapsulating a packaging structure provided by a second embodiment of the present invention.
Figure 6:
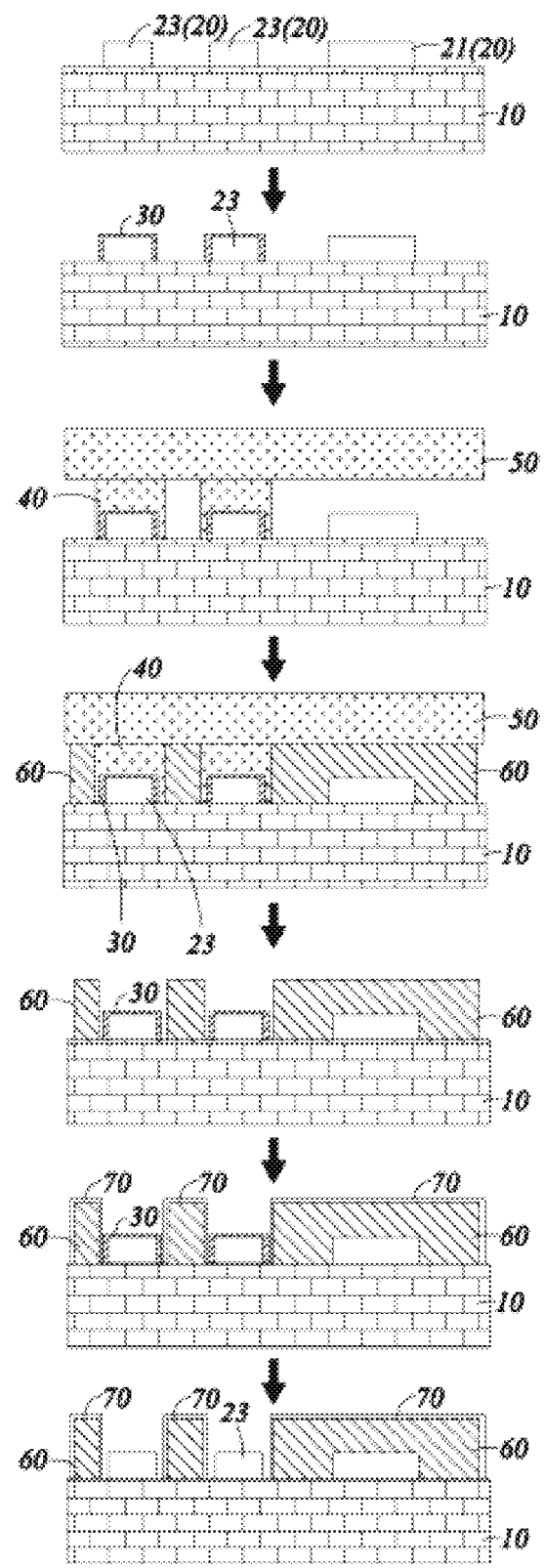
FIG. 6 is a step diagram corresponding to the packaging method shown in FIG. 5 of the present invention.

As shown in FIGS. 5 and 6, the packaging method for selectively encapsulating a packaging structure provided in a second embodiment of the present invention is similar to the packaging method for selectively encapsulating the packaging structure provided in the first embodiment. The difference lies in that in the packaging structure provided in the second embodiment, the encapsulated component 21 needs to be electromagnetically shielded.

Accordingly, the second embodiment is improved on the basis of the packaging method for selectively encapsulating the packaging structure provided in the first embodiment. In the second embodiment, a step P1 is added after the step S4 in the first embodiment, and the step P1 includes: sputtering a metal layer 70 outside the encapsulating area.

It can be understood that in the second embodiment, the step P1 may be performed either between steps S4 and S5 or after step S5. The performing sequence does not affect the final packaging structure, which will not be further described herein.

Figure 7:
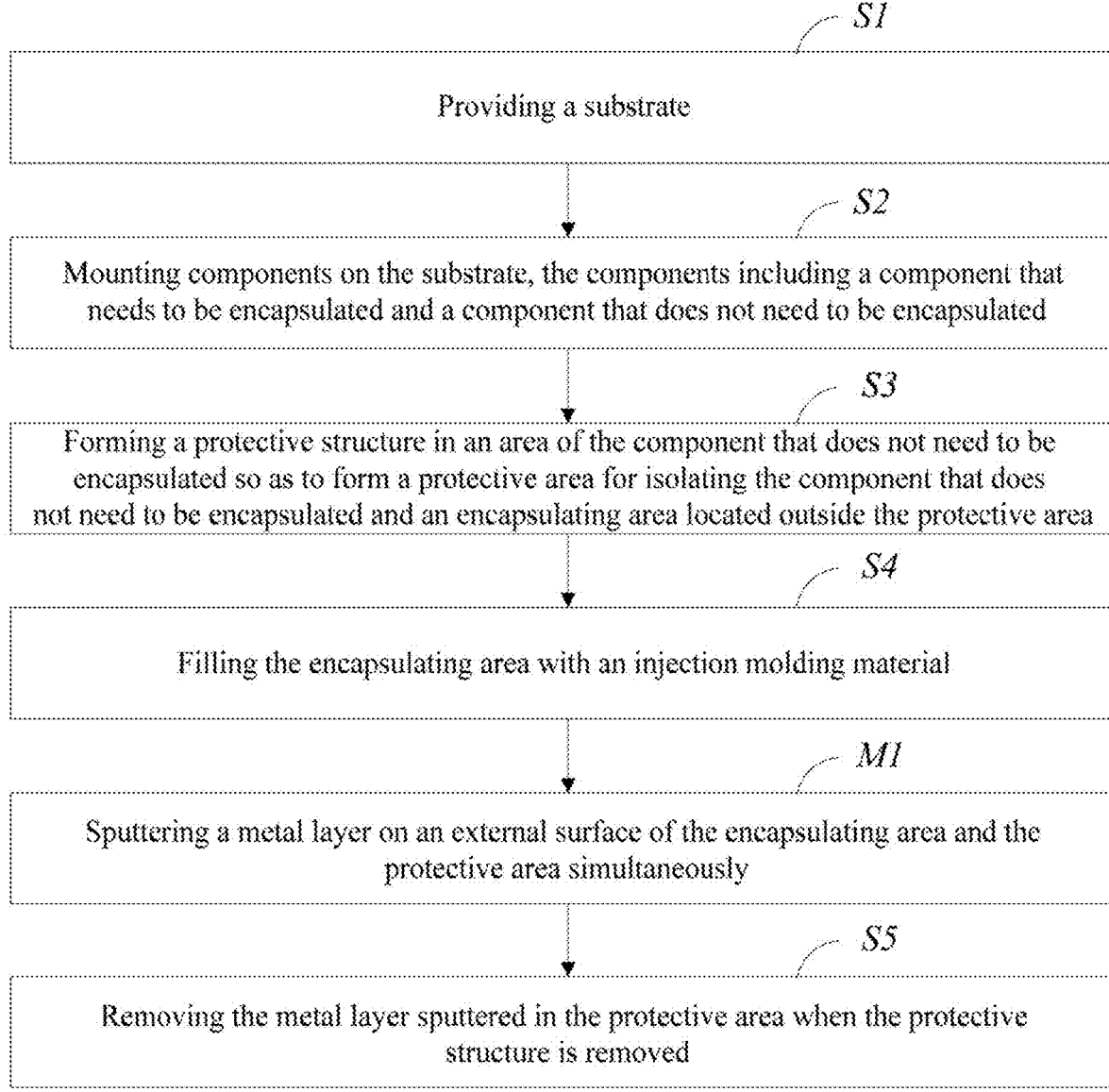
FIG. 7 is a flow diagram of a packaging method for selectively encapsulating a packaging structure provided by a third embodiment of the present invention.
Figure 8:
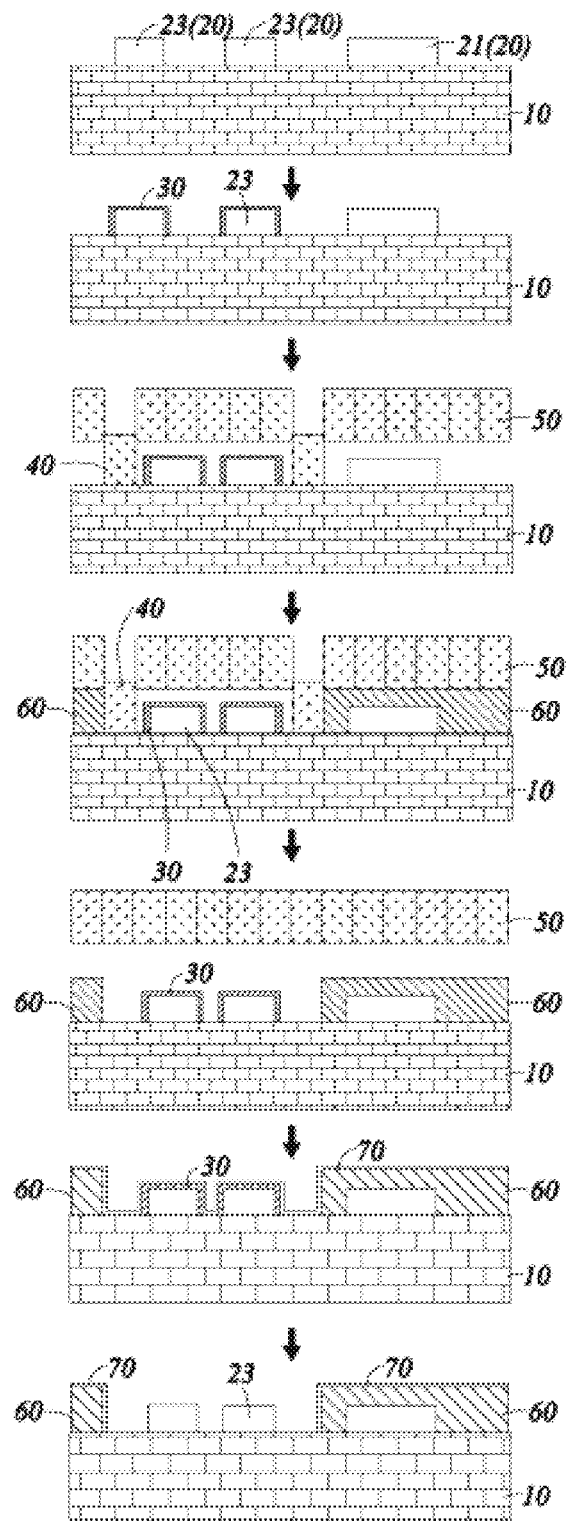
FIG. 8 is a step diagram corresponding to the packaging method shown in FIG. 7 of the present invention.

As shown in FIGS. 7 and 8, the packaging method for selectively encapsulating a packaging structure provided in a third embodiment of the present invention is similar to the packaging method for selectively encapsulating the packaging structure provided in the second embodiment which is also improved on the basis of the first embodiment. Similarly, the encapsulated component 21 needs to be electromagnetically shielded.

The difference between this embodiment and the second embodiment lies in that during the process of electromagnetically shielding the component 21 in the packaging structure, the position of the sputtered metal layer is slightly adjusted. This embodiment which is based on the first embodiment includes a step M1 of sputtering a metal layer 70 on an external surface of the encapsulating area and the protective area simultaneously after the step S4. Further, step S5 specifically includes: removing the sputtered metal layer 70 in the protective area when the protective structure is removed.

The third embodiment is similar to the second embodiment in that the metal layer can be sputtered either before or after the protective structure is removed. Accordingly, the order of removing the metal layer will also be adjusted, which will not be further described herein.

Figure 9:
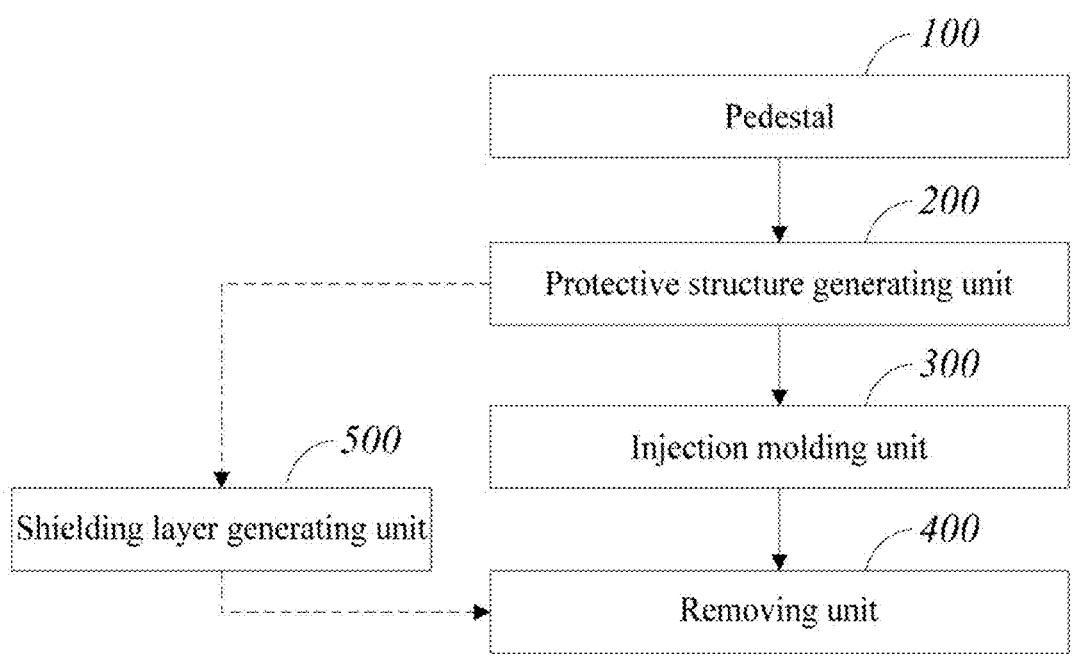
FIG. 9 is a schematic module diagram of a packaging device for selectively encapsulating a packaging structure provided by the first embodiment of the present invention.

As shown in FIG. 9, the packaging device for selectively encapsulating the packaging structure provided in an embodiment of the present invention includes: a pedestal 100, a protective structure generating unit 200, an injection molding unit 300, and a removing unit 400.

The pedestal 100 is configured to bear a substrate on which a component that needs to be encapsulated and a component that does not need to be encapsulated are mounted.

The protective structure generating unit 200 is configured to form a protective structure in an area of the component that does not need to be encapsulated so as to form a protective area for isolating the component that does not need to be encapsulated and an encapsulating area located outside the protective area.

In a preferred embodiment of the present invention, a protective film is mounted on an external surface of the component that does not need to be encapsulated by the protective structure generating unit 200; and a temporary protective cover is formed outside the protective film so as to form a protective area for isolating the component that does not need to be encapsulated and an encapsulating area located outside the protective area.

Further, in a preferred embodiment of the present invention, a temporary protective cover is formed outside a protective film by the protective structure generating unit 200, wherein a sealed chamber is enclosed between the temporary protective cover and a substrate, and the sealed chamber contacts with the protective film or a gap is provided between the sealed chamber and the protective film. The temporary protective cover arranged in this way can play a double-protection role. The temporary protective cover can prevent water vapor, plastic packaging materials and the like from entering the sealed chamber, so as to avoid contaminating the component that does not need to be encapsulated, and can avoid damaging the component that does not need to be encapsulated when there is a gap between the protective cover and the component that does not need to be encapsulated, and the size of the protective area can be flexibly controlled by the volume of the protection cover.

In a preferred embodiment of the present invention, the protective structure generating unit 200 is further configured to: for each component that does not need to be encapsulated, form an independent temporary protective cover outside the component that does not need to be encapsulated so as to form a protective area, or for adjacent components that do not need to be encapsulated, form a same temporary protective cover outside the adjacent components that do not need to be encapsulated so as to form the protective area.

The injection molding unit 300 is configured to fill the encapsulating area with an injection molding material.

The removing unit 400 is configured to remove the protective structure.

Further, the packaging device may optionally further include: a shielding layer generating unit 500 for sputtering a metal layer 70 outside the packaging area or sputtering a metal layer on an external surface of the packaging area and the protective area simultaneously.

Upon the metal layer is sputtered on the external surface of the encapsulating area and the protective area simultaneously by the shielding layer generating unit 500, the removing unit 400 is further configured to remove the metal layer sputtered in the protective area when the protective structure is removed.

In summary, with the packaging method and the packaging device for selectively encapsulating the packaging structure provided in the present invention, any part of the packaging structure may be selectively encapsulated by self-adjustment as required, the operation is simple, and the process flow is simplified.

Those skilled in the art can clearly understand that, for the convenience and conciseness of the description, the specific working process of the system described above can be referred to the corresponding process in the embodiment of the aforementioned method, which will not be repeated herein.

It should be understood that although the specification is described according to the embodiments, not every embodiment contains only an independent technical solution. The specification is described in this way only for the sake of clarity. Those skilled in the art should consider the specification as a whole, and the technical solutions in the various embodiments can also be appropriately combined to form other embodiments that can be understood by those skilled in the art.

A series of detailed descriptions listed above are merely specific descriptions of the feasible embodiments of the present invention, and are not intended to limit the scope of protection of the present invention. Any equivalent embodiments or changes made without departing from the technical spirit of the present invention should be included in the scope of protection of the present invention.

What is claimed is:

1. A packaging method for selectively encapsulating a packaging structure, comprising:
    step 1 (S1), providing a substrate;
    step 2 (S2), mounting components on the substrate, the components comprising a component that needs to be encapsulated and a component that does not need to be encapsulated;
    step 3 (S3), forming a protective structure in an area of the component that does not need to be encapsulated so as to form a protective area for completely isolating the component that does not need to be encapsulated from an encapsulating area located outside the protective area;
    step 4 (S4), filling the encapsulating area with an injection molding material; and
    step 5 (S5), removing the protective structure;
    wherein the step 3 (S3) of forming the protective structure specifically comprises:
    mounting a protective film on an external surface of the component that does not need to be encapsulated; and
    forming a temporary protective cover outside the protective film so as to form the protective area for isolating the component that does not need to be encapsulated and the encapsulating area located outside the protective area.

2. The packaging method for selectively encapsulating the packaging structure according to claim 1, wherein forming the temporary protective cover outside the protective film specifically comprises:
    forming the temporary protective cover outside the protective film, wherein a sealed chamber is enclosed between the temporary protective cover and the substrate, and the sealed chamber contacts with the protective film or a gap is provided between the sealed chamber and the protective film.

3. The packaging method for selectively encapsulating the packaging structure according to claim 1, wherein forming the temporary protective cover outside the protective film specifically comprises:
    for each component that does not need to be encapsulated, forming an independent temporary protective cover outside the component that does not need to be encapsulated so as to form the protective area; or
    for adjacent components that do not need to be encapsulated, forming a same temporary protective cover outside the adjacent components that do not need to be encapsulated so as to form the protective area.

4. The packaging method for selectively encapsulating the packaging structure according to claim 1, wherein after the step 4 (S4), the method further comprises:
    sputtering a metal layer on an external surface of the encapsulating area.

* * * * *